United States Patent [19]
Yonemoto

[11] Patent Number: 5,286,989
[45] Date of Patent: Feb. 15, 1994

[54] SOLID STATE IMAGING DEVICE

[75] Inventor: Kazuya Yonemoto, Tokyo, Japan

[73] Assignee: Sony Corporation, Tokyo, Japan

[21] Appl. No.: 901,099

[22] Filed: Jun. 19, 1992

[30] Foreign Application Priority Data
Jun. 19, 1991 [JP] Japan .................... 3-174627

[51] Int. Cl.⁵ .................... H01L 29/78; H01L 27/14; H01L 31/00
[52] U.S. Cl. .................... 257/239; 257/221; 257/223; 257/224; 257/229; 257/232; 257/233; 257/240; 257/243; 377/60; 377/62; 348/311; 348/313
[58] Field of Search .................. 357/24 LR, 24 M, 24; 377/60, 62, 63; 358/213.22, 213.26, 213.29, 213.31; 257/221, 223, 224, 229, 232, 233, 239, 240, 243

[56] References Cited
U.S. PATENT DOCUMENTS
4,949,183 8/1990 Stevens .................... 357/24 LR
5,103,278 4/1992 Miwada .................... 377/60

Primary Examiner—Ngan Ngo
Attorney, Agent, or Firm—Hill, Steadman & Simpson

[57] ABSTRACT

A solid imaging device that minimizes the degradation in charge transfer efficiency attributable to narrow channel effect by enlarging the apparent width of the horizontal output gate outlet. Miniaturization of the floating diffusion (FD) region is not hampered despite the apparent widening of the horizontal output gate outlet. The inventive imaging device utilizes a floating diffusion amplifier as the charge detector that detects a charge signal transferred from a horizontal CCD. In this device structure, ions are implanted into the substrate surface side of the region adjacent to the FD region in the horizontal output gate in such a manner that the channel potential of the adjacent region will become appropriately deeper than that of the forward-half region next to the adjacent region.

4 Claims, 3 Drawing Sheets

SOLID STATE IMAGING DEVICE

BACKGROUND OF THE INVENTION

1. Field of the Invention

The present invention relates to a solid state imaging device and, more particularly, to a solid state imaging device using a floating diffusion amplifier as the charge detector for detecting a charge signal transferred from a horizontal charge transferring unit.

2. Description of the Prior Art

FIG. 3 is a block diagram of a CCD solid state imaging device that embodies the invention by operating as an interline transfer system. In FIG. 3, the device has an imaging region 4 made of a plurality of photo-sensors 1, a plurality of read gates 2 and a plurality of vertical CCD's (vertical charge transferring means) 3. The photo-sensors constitute a two-dimensional picture element-based sensor array that accumulates a charge signal proportionate to the amount of the light received. The charge signal is read out instantaneously during a vertical blanking period via the read gates 2. The charge signal thus read out is transferred vertically by the vertical CCD's 3.

On the output side of the imaging region 4 is a horizontal CCD (horizontal charge transferring means) 5. Receiving the charge signal transferred per line from the vertical CCD's of the imaging region 4, the horizontal CCD 5 transfers the signal horizontally in accordance with the horizontal scanning period of a TV signal. After leaving the horizontal CCD 5, the charge signal is detected by a charge detector 6 that produces a corresponding electrical signal.

Prior art CCD solid state imaging devices of the above-described type are designed to have a horizontal CCD channel region 10 wide enough to handle adequately the charges in the horizontal CCD 5, as illustrated in FIG. 4. At the same time, this type of CCD solid state imaging device includes the smallest possible FD (floating diffusion) region 7 of the floating diffusion amplifier implemented by the charge detector 6. The FD region 7 thus restricted is intended to enhance the sensitivity of the CCD solid state imaging device.

As shown in FIG. 4, the prior art CCD solid state imaging device lets the charge signal spread fully across the width of the horizontal CCD channel region 10 and then throttles the signal abruptly at a horizontal output gate (HOG) 8 of the horizontal CCD 5 for charge transfer to the FD region 7. Because designing the FD region 7 smaller necessarily narrows the channel width W of the outlet of the horizontal output gate 8, there occurs what is known as the narrow channel effect.

FIG. 5 is a section taken on line A—A' in FIG. 4. The narrow channel effect produces a shallow potential region at the outlet of the horizontal output gate 8, the region being enclosed by broken line P in FIG. 5. The region forms a potential barrier that traps, in the horizontal output gate 8, part of the charge signal transferred thereto from the horizontal CCD 5. The trapped charge is not transferred to the FD region 7.

Making the FD region 7 smaller makes the outlet of the horizontal output gate 8 narrower in channel width W. The resulting narrow channel effect produces the potential barrier at the outlet of the horizontal output gate 8, the barrier degrading the efficiency of charge signal transfer. Conversely, the predicted deterioration in charge signal transfer at the horizontal output gate 8 is a prior art impediment that discourages making the FD region 7 smaller to enhance the sensitivity of the CCD solid stage imaging device.

SUMMARY OF THE INVENTION

It is therefore an object of the present invention to provides a solid state imaging device that widens the apparent width of the horizontal output gate outlet so that charge transfer deterioration attributable to the narrow channel effect will be minimized without hampering the miniaturization of the FD region.

In carrying out the invention and according to one aspect thereof, there is provided a solid state imaging device formed on a semiconductor body comprising: a plurality of photo sensing elements formed in a matrix configuration, the plurality of photo sensing elements receiving light and producing a charge signal corresponding to the amount of the light received; a plurality of vertical charge transferring means for receiving the charge signal from the photo sensing elements and transferring the charge signal in the vertical direction; a horizontal charge transferring means for transferring the charge signal in the horizontal direction to a charge detecting section; the charge detecting section including an electrically floating diffusion region having a fixed width, a floating diffusion amplifier connected to the floating diffusion region and a transistor for resetting the floating diffusion region to a predetermined potential; the horizontal charge transferring means including a channel formed of the semiconductor body, a plurality of electrode means insulated from the channel and an output gate electrode formed on one end of the horizontal charge transferring means, the channel having a width wider than the fixed width of the floating diffusion region and containing a wide portion beneath the plurality of electrode means and a narrow portion beneath the output gate electrode; the narrow portion having a potential shift in the charge transfer direction so that a region adjacent to the floating diffusion region has deeper potential than a region adjacent to the wide portion.

According to another aspect of the invention, there is provided a charge transfer device formed on a semiconductor body comprising: a charge detecting section including an electrically floating diffusion region having a fixed width, a floating diffusion amplifier connected to the floating diffusion region and a transistor for resetting the floating diffusion to a predetermined potential; a charge transfer section including a channel formed on the semiconductor body, a plurality of electrode means insulated from the channel and an output gate electrode formed on one end of the charge transfer section, the channel having a width wider than the fixed width of the floating diffusion region and containing a wide portion beneath the plurality of electrode means and a narrow portion beneath the output gate electrode; the narrow portion beneath a potential shift in the charge transfer direction so that a region adjacent to the floating diffusion region has deeper potential than a region adjacent to the wide portion.

In an embodiment of the invention, the substrate surface side of a region adjacent to the FD region in the horizontal output gate is adjusted in the density of impurities in such a way that the channel potential of the adjacent region will become suitably deeper than that of a forward-half region next to the adjacent region. This causes the potential of the region adjacent to the FD region to be subject to a secondary modulation derived from the potential of the forward-half region and from the deep potential of the FD region. This in turn cancels the potential barrier attributable to the narrow channel effect caused by the narrow width of the horizontal output gate outlet.

Further objects, features and advantages of the invention will become more apparent upon a reading of the following description and appended drawings.

DESCRIPTION OF THE PREFERRED EMBODIMENT

Figure 1A:
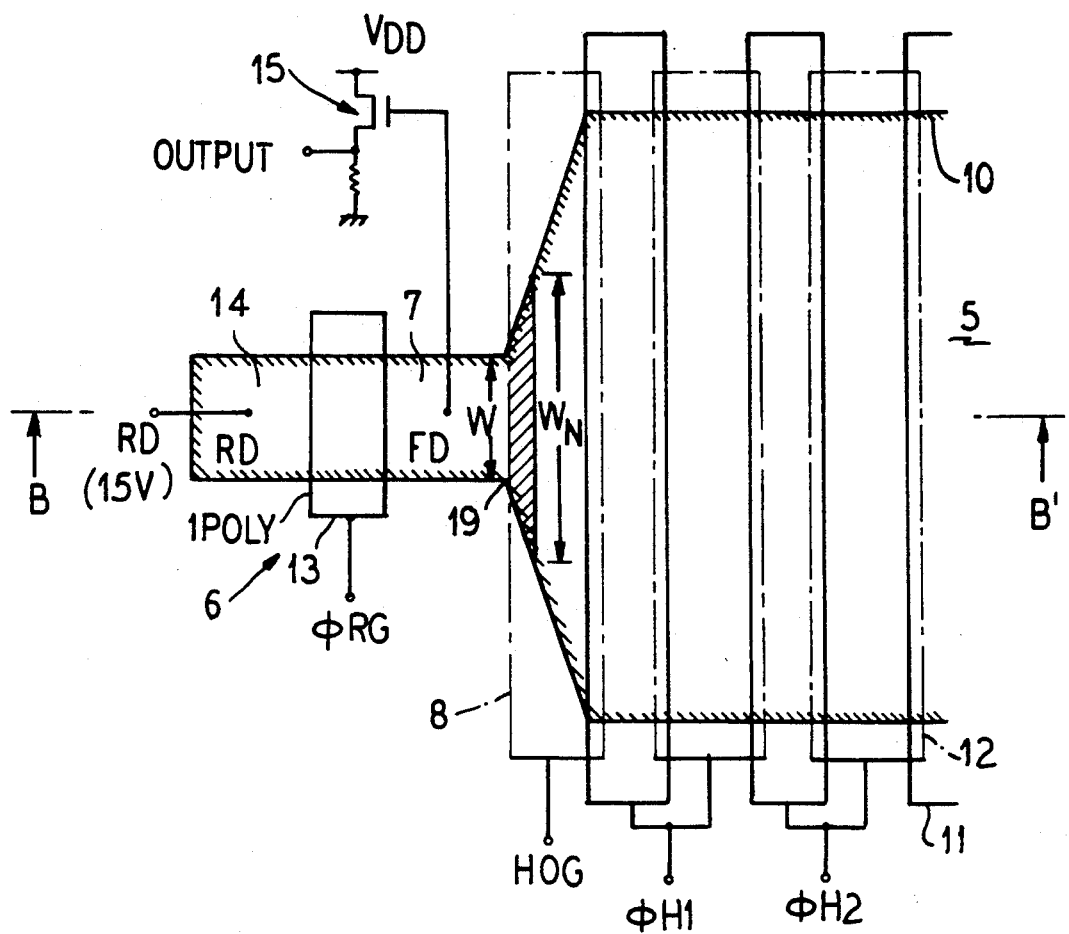
FIGS. 1A and 1B are a set of views showing a solid state imaging device embodying the invention, FIG. 1A being a schematic plan view of a horizontal charge transferring means of the embodiment, FIG. 1B being a section taken on line B—B' in FIG. 1A.
Figure 1B:
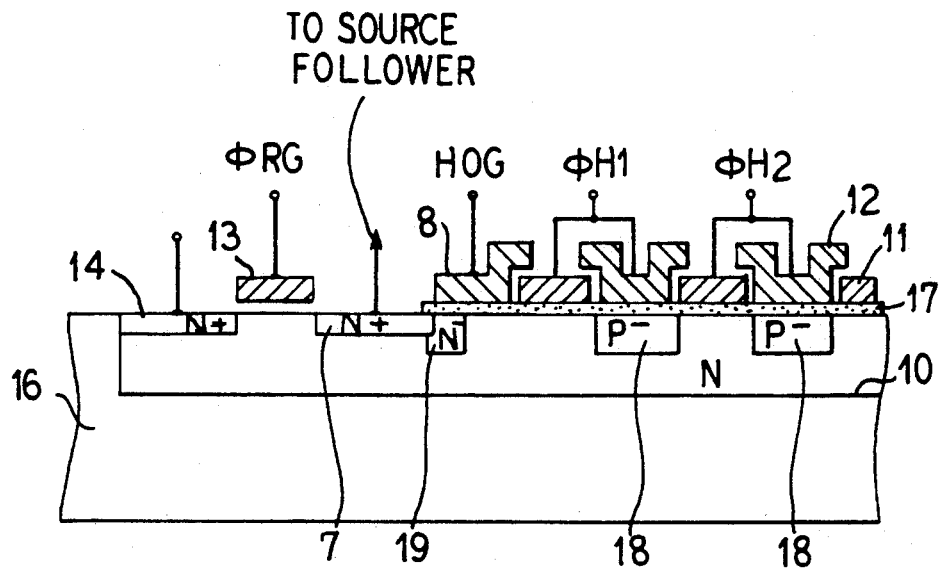

One preferred embodiment of the invention will now be described with reference to the accompanying drawings. FIGS. 1A and 1B are a set of views illustrating the embodiment of the invention. FIG. 1A is a schematic plan view of a horizontal charge transferring means of the embodiment, and FIG. 1B is a section taken on line B-B' in FIG. 1A. In FIG. 1A, a channel region 10 of a horizontal CCD 5 is indicated by solid lines with shadings. Storage gates 11 each made of a first polysilicon 1POLY (shown by solid line) and transfer gates 12 each composed of a second polysilicon 2POLY (dashed line) are alternated to form pairs of electrodes. In turn, the pairs of electrodes constitute the horizontal CCD 5.

At the left-hand end of the horizontal CCD 5 is a horizontal output gate 8. The horizontal output gate 8 is connected with a FD (floating diffusion) region 7 of the floating diffusion amplifier implemented by a charge detector 6. The potential of the FD region 7 is reset one picture element at a time by a reset gate 13 and a reset drain 14. The FD region 7 comprises a source follower circuit 15 to which the gate of a MOS transistor is connected. The source follower circuit 15 turns the charge signal transferred thereto into an output signal.

Referring to FIG. 1B, a channel region 10 of the horizontal CCD 5 is formed on the surface side of a silicon substrate 16. On the silicon substrate 16 are transfer electrodes comprising storage gates 11 and transfer gates 12, the gates 11 and 12 each being made of the first polysilicon 1POLY and the second polysilicon 2POLY, respectively. The gates 11 and 12 are insulated from the silicon substrate 16 by means of a gate insulation film 17. Beneath the electrodes of the transfer gates 12 to which horizontal transfer clock signals $\phi_{H1}$ and $\phi_{H2}$ are applied are ion implantation regions (P−) 18. The regions 18 are intended to make the potential shallower for implementation of two-phase drive.

The horizontal output gate 8 at the left-hand end of the horizontal CCD 5 is generally kept to a DC potential level such as ground level. The reset gate 13 is provided to reset the change in the potential of the FD region 7, the change being attributable to the charge signal given per picture element. With this arrangement, the potential of the FD region 7 is reset to the potential of the reset drain 14.

At the horizontal output gate 8 of the horizontal CCD 5, ions are illustratively implanted into the substrate surface side of a region 19 (shown shaded in FIG. 1A) which is adjacent to the FD region 7 and which is preferably about a half of the horizontal output gate 8 in width. The ion implantation establishes the impurity density of the region 19 in such a manner that the channel potential of the region 19 will become suitably deeper than that of the forward-half region next to the region 19. The ion implanted region (N−) 19 is formed so that the channel potential thereof will be from several hundred mV to several V deep.

Figure 2:
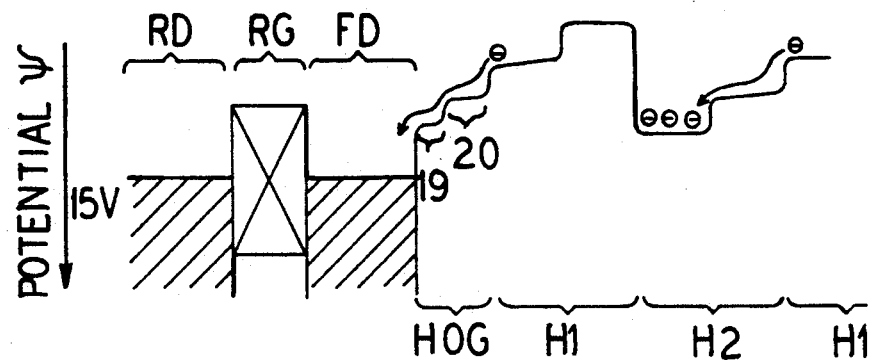
FIG. 2 is a potential diagram indicating the potential status corresponding to the section of the horizontal charge transferring means.
Figure 3:
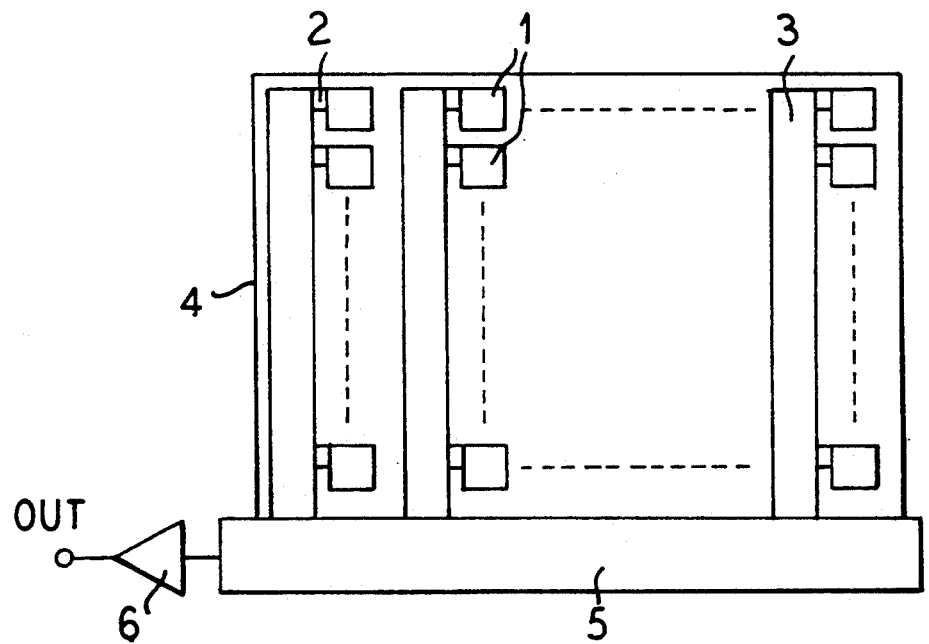
FIG. 3 is a block diagram of a prior art CCD solid state imaging device operating as an interline transfer system.
Figure 4:
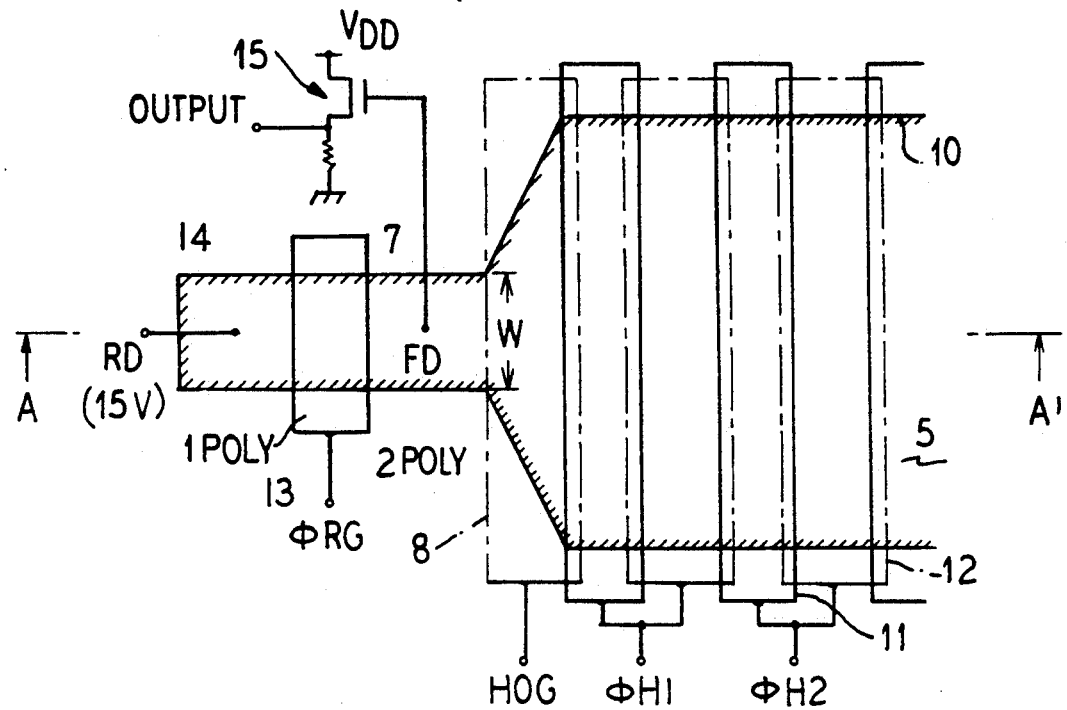
FIG. 4 is a schematic plan view of a typical prior art horizontal charge transferring means.
Figure 5:
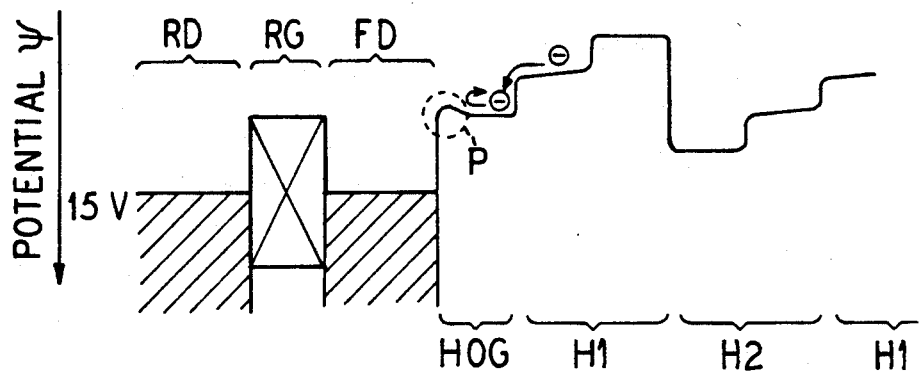
FIG. 5 is a potential diagram depicting the potential status corresponding to the section taken on line A—A' in FIG. 4.

In the manner described, the region 19 adjacent to the FD region 7 is given on its substrate surface side an impurity density such that the channel potential of the region 19 is appropriately deeper than that of the forward-half region 20 next thereto. In this setup, as shown in the potential diagram of FIG. 2 corresponding to the section of FIG. 1B, the potential of the ion implanted region 19 is subject to the two-dimensional modulation caused by the potential of the forward-half region 20 in the horizontal output gate 8 and by the deep potential of the FD region 7. The result is the cancellation of the potential barrier produced by the narrow channel effect which is attributable to the narrow channel width W at the outlet of the horizontal output gate 8.

Meanwhile, the channel length of the horizontal output gate 8 is determined by the forward-half region 20 having the shallow potential in the gate 8. This means that the effective channel length in the above case is shortened. Furthermore, as depicted in the plan view of FIG. 1A, the channel width of the outlet of the horizontal output gate 8 is apparently enlarged from W to $W_N$.

Cancellation of the potential barrier stemming from the narrow channel effect, shortening of the effective channel length and the apparent enlarging of the channel width combine to provide the horizontal CCD 5 with a dramatically enhanced level of charge transfer efficiency. This feature enables the solid stage imaging device to offer charge transfer speeds high enough to deal adequately with high-definition television signal transmission.

As described, in the solid state imaging device according to the invention, the substrate surface side of the region adjacent to the FD region in the horizontal output gate is adjusted in impurity density in such a way that the channel potential of the adjacent region will become appropriately deeper than that of the forward-half region next to the adjacent region. This constitution prevents the formation of a potential barrier otherwise caused by the narrow channel effect and enlarges the apparent channel width of the horizontal output gate outlet. With these advantages, the invention minimizes the degradation in charge transfer efficiency conventionally caused by the narrow channel effect while ensuring further miniaturization of the FD region.

It is to be understood that while the invention has been described in conjunction with a specific embodiment, it is evident that many alternatives, modifications and variations will become apparent to those skilled in the art in light of the foregoing description. Accordingly, it is intended that the present invention embrace all such alternatives, modifications and variations as fall within the spirit and scope of the appended claims.

What is claimed is:

1. A solid state imaging device formed on a semiconductor body comprising:
   a plurality of photo sensing elements formed in a matrix configuration, said plurality of photo sensing elements receiving light and producing a charge signal corresponding to the amount of the light received;
   a charge detecting section;
   a plurality of vertical charge transferring means for receiving said charge signal from said photo sensing elements and transferring said charge signal in a vertical direction; and
   a horizontal charge transferring means for transferring said charge signal in a horizontal direction to said charge detecting section;
   said charge detecting section including an electrically floating diffusion region having a fixed width, a floating diffusion amplifier connected to said floating diffusion region and a transistor for resetting said floating diffusion region to a predetermined potential;
   said horizontal charge transferring means receiving a potential and including a charge transfer channel formed on said semiconductor body, a plurality of electrode means insulated from and positioned over said charge transfer channel, and an output gate electrode formed over said charge transfer channel on one end of said horizontal charge transferring means, said charge transfer channel having a first channel portion beneath said plurality of electrode means with a width wider than the fixed width of said floating diffusion region, a second channel portion beneath said output gate electrode with a width narrower than the width of said first channel portion, said second channel portion including a first impurity diffusion region therein adjacent to said floating diffusion region and a second impurity diffusion region therein located between said first channel portion and said first impurity diffusion region, wherein said first impurity diffusion region and said second impurity diffusion region have different impurity densities so that a potential of said first impurity diffusion region is deeper than that of said second impurity diffusion region, and wherein an apparent channel width at an outlet of said second channel portion is effectively enlarged to a channel width at a boundary between said first impurity diffusion region and said second impurity diffusion region, and an effective channel length of said second channel portion corresponds to a channel length of said second impurity diffusion region.

2. A solid state imaging device according to claim 1, wherein said potential of said first impurity diffusion region is shallower than the potential of said floating diffusion region.

3. A charge transfer device formed on a semiconductor body comprising:
   a charge detecting section including an electrically floating diffusion region having a fixed width, a floating diffusion amplifier connected to said floating diffusion region and a transistor for resetting said floating diffusion region to a predetermined potential;
   a charge transfer section receiving a potential and including a charge transfer channel formed on said semiconductor body, a plurality of electrode means formed over said channel and insulated form said channel and an output gate electrode formed over one end of said charge transfer section, said charge transfer channel having a first channel portion beneath said electrode means that is wider than the fixed width of said floating diffusion region, a second channel portion beneath said output gate electrode that narrows from said first channel portion to said floating diffusion region, said second channel portion including a first impurity diffusion region adjacent to said floating diffusion region and a second impurity diffusion region located between said first channel portion and said first impurity diffusion region, wherein said first impurity diffusion region and said second impurity diffusion region have different impurity densities so that a potential of said first impurity diffusion region is deeper than that of said second impurity diffusion region, and wherein an apparent channel width at an outlet of said second channel portion is effectively enlarged to a channel width at a boundary between said first impurity diffusion region and said second impurity diffusion region, and an effective channel length of said second channel portion corresponds to a channel length of said second impurity diffusion region.

4. A charge transfer device according to claim 3, wherein said potential of said first impurity diffusion region is shallower than the potential of said floating diffusion region.

* * * * *